United States Patent
Kim et al.

(10) Patent No.: US 6,498,370 B1
(45) Date of Patent: Dec. 24, 2002

(54) SOI SEMICONDUCTOR INTEGRATED CIRCUIT FOR ELIMINATING FLOATING BODY EFFECTS IN SOI MOSFETS AND METHOD OF FABRICATING THE SAME

(75) Inventors: Young-Wug Kim, Suwon (KR); Byung-Sun Kim, Suwon (KR); Hee-Sung Kang, Sungnam-shi (KR); Young-Gun Ko, Songpa-ku (KR); Sung-Bae Park, Kunpo (KR)

(73) Assignee: Samsung Electronics Co., Ltd. (KR)

( * ) Notice: Subject to any disclaimer, the term of this patent is extended or adjusted under 35 U.S.C. 154(b) by 46 days.

(21) Appl. No.: 09/695,341

(22) Filed: Oct. 24, 2000

Related U.S. Application Data

(60) Provisional application No. 60/161,479, filed on Oct. 25, 1999.

(51) Int. Cl.$^7$ .............................................. H01L 27/01
(52) U.S. Cl. ...................................... 257/347; 438/149
(58) Field of Search ........................... 257/347; 438/149

(56) References Cited

U.S. PATENT DOCUMENTS

| | | | |
|---|---|---|---|
| 5,623,155 A | 4/1997 | Kerber et al. ................ | 257/347 |
| 5,729,039 A | 3/1998 | Beyer et al. ................. | 257/347 |
| 5,973,364 A | 10/1999 | Kawanaka .................... | 257/347 |
| 6,191,449 B1 * | 2/2001 | Shino .......................... | 257/347 |
| 6,288,425 B1 * | 9/2001 | Adan ........................... | 257/347 |
| 6,348,714 B1 * | 2/2002 | Lin et al. ..................... | 257/347 |
| 6,414,355 B1 * | 7/2002 | An et al. ...................... | 257/347 |
| 2002/0048972 A1 * | 4/2002 | Yamaguchi et al. ......... | 438/926 |

OTHER PUBLICATIONS

Assaderaghi, Fariborz, Dynamic Threshold Voltage MOSFET (DTMOS) for Very Low Voltage Operation, IEEE Electron Device Letters, v 15, n 12, Dec. 1994, p. 510–512.
Sleight, Jeffrey W., DC and Transient Characterization of a Compact Schottky Body Technology for SOI Trnsistors, IEEE Transactions on Electron Devices, v 46, n 7, 1999, p. 1451–1456.

* cited by examiner

*Primary Examiner*—Richard Elms
*Assistant Examiner*—Christian D. Wilson
(74) *Attorney, Agent, or Firm*—Mills & Onello LLP

(57) ABSTRACT

A silicon-on-insulator (SOI) integrated circuit and a method of fabricating the SOI integrated circuit are provided. At least one isolated transistor active region and a body line are formed on an SOI substrate. The transistor active region and the body line are surrounded by an isolation layer which is in contact with a buried insulating layer of the SOI substrate. A portion of the sidewall of the transistor active region is extended to the body line. Thus, the transistor active region is electrically connected to the body line through a body extension. The body extension is covered with a body insulating layer. An insulated gate pattern is formed over the transistor active region, and one end of the gate pattern is overlapped with the body insulating layer.

14 Claims, 14 Drawing Sheets

SOI SEMICONDUCTOR INTEGRATED CIRCUIT FOR ELIMINATING FLOATING BODY EFFECTS IN SOI MOSFETS AND METHOD OF FABRICATING THE SAME

RELATED APPLICATION

This application is based on U.S. Provisional Patent Application serial No. 60/161,479, filed on Oct. 25, 1999.

FIELD OF THE INVENTION

The present invention generally relates to silicon-on-insulator (SOI) technology, and more particularly to an SOI semiconductor integrated circuit for eliminating floating body effects in SOI MOSFETs and a method of fabricating the same.

DESCRIPTION OF THE RELATED ART

In the semiconductor manufacturing industry, there has been a great deal of attention paid to reducing parasitic capacitance and resistance to increase the operating speed of semiconductor integrated circuits. SOI MOSFETs have been demonstrated to be superior to bulk silicon MOSFETs in terms of low power, high speed very large scale integration (VLSI) applications because of their inherent merits such as less junction capacitance and better device isolation. In addition, there are many advantages in SOI devices such as better immunity to soft errors, reduction in dynamic power, improvement in latch-up resistance even with increased packing density. Despite the above outstanding features of SOI devices, SOI integrated circuits have suffered some lack of commercial success due to technical problems in material processing and device design.

FIG. 1 depicts a typical structure of an SOI MOSFET according to the prior art. The SOI MOSFET includes a gate electrode 20, a gate dielectric 21, a source 23 and drain 24 on insulating layer 15. A backside surface of the insulating layer 15 is in contact with a supporting substrate 10.

Since the body region 30 of the SOI MOSFET is isolated by the insulating layer 15, it is electrically isolated and therefore its voltage varies with the voltage applied to either source region 23, drain region 24, or gate electrode 20.

The voltage fluctuation of the body region 30 in SOI MOSFET, commonly referred to as the floating body effect (FBE), causes detrimental effects for the proper operation of SOI devices. The most common of these detrimental effects are the kink effect and the bipolar effect. With the channel region of the device partially depleted and a high drain voltage applied, the electric field created in the device causes impact ionization near the drain region 24.

Accordingly, in the event that the SOI MOSFET is an SOI N-MOSFET, the generated holes are injected into the body thereby creating a positively charged body. The first consequence of this positive charge accumulated in the body 30 is the increase of the body potential resulting in a decrease of the threshold voltage ($V_T$) of the SOI MOSFET. Since the decrease of the threshold voltage raises the drain current, the variation of threshold voltage shows up as kinks in the output characteristics of the SOI MOSFETs.

Another consequence of the voltage increase is the eventual turn-on of the lateral bipolar structure since the MOSFET includes a lateral bipolar transistor, i.e., the n-p-n construction 23, 30, and 24. As the body 30 of the MOSFET becomes positively biased, the source-body (23–30) junction, corresponding to emitter-base junction of the lateral n-p-n construction, becomes forward biased, and electrons are injected from the source 23 into the body region 30. The injected electrons reaching the drain depletion region add to the drain current. Consequently, the drain current is dominantly controlled by the parasitic bipolar transistor rather than by the channel current under the gate electrode control. This effect is referred to as the parasitic "bipolar" effect. The parasitic bipolar action of the SO MOSFET induces a "dynamic leakage current" (DLC) especially in a switching circuit.

In a MUX (multiplexer) circuit as depicted in FIG.2A, if the applied voltages at nodes A and B are high, then the output node C will be high. If the gate voltage of the node A is switched to a low voltage, then the output node C should be kept to a high voltage. However, in a state that the nodes A and C keep a low voltage and a high voltage, respectively, if the voltage at node B is switched to a low voltage for some reason, the output voltage at node C drops instantaneously by the dynamic leakage mechanism due to the parasitic bipolar effect. FIG.2B illustrates the instantaneous drop of the output voltage at node C in the multiplexer circuit according to the prior art. Here, the x-axis represents time (t) and the y-axis represents voltage of the node C.

In order to remedy those detrimental effects due to the floating body effect observed in SOI MOSFETs, several technical approaches have been proposed. For instance, F. Assaderaghi et al. proposed a technique for reducing the floating body effect in their technical paper entitled, "A dynamic threshold voltage MOSFET (DTMOS) for very low voltage operation," published in IEEE Electron Device Lett., pp.510–512, Vol.15, No.12, 1994. F. Assaderaghi et al. tried to eliminate the floating body effect by tying the floating body to the gate of the SOI MOSFET. However, since the dynamic leakage current cannot be avoided between source and drain when the gate voltage is high while keeping source and drain low, they pointed out that their approach is only applicable to the low voltage operation.

As another approach to resolve the floating body problem in SOI devices, J.W. Sleight et al. proposed a Schottky body contact technology in a technical paper entitled, "DC and transient characterization of a compact Schottky body contact technology for SOI transistors," published in IEEE Transactions on Electron Devices, pp.1451–1456, Vol.46, No.7, Jul. 1999. This technical paper provides a self-aligned Schottky diode method for body contacting partially depleted SOI transistors. In their paper, Schottky diodes are placed at source/drain terminals, allowing the floating body to be tied to the source/drain region.

FIGS.3A and 3B are schematic layout diagrams for implementing body contact tied to source/drain and gate, respectively, according to the prior art. Referring to FIG.3A, $n^+$ source 23 is tied to the body 30 through $p^+$ regions 31. Referring to FIG.3B illustrating the gate-body contact in accordance with the first prior art paper mentioned above, the body 30 is electrically connected to the gate electrode 20 through electrical contact 33.

However, it should be noted that the body contacting schemes either to source or gate disclosed in the prior art have fundamental limitations in their application to commercial SOI integrated circuits. Namely, since only the weak parts vulnerable to the dynamic leakage current out of the whole circuit are manually cured by contacting the floating body according to the prior art, it is difficult to resolve the inherent floating body problem in SOI integrated circuits.

For instance, only 50 to 100 thousand transistors are usually body-contacted to remedy the floating body effect out of 1.5 million transistors comprising the 64-bit microprocessor fabricated on SOI substrate.

SUMMARY OF THE INVENTION

In view of these problems, there is need for a method and structure for fundamentally eliminating the floating body effect in SOI semiconductor integrated circuits, which is not subject to these limitations.

Accordingly, it is an object of the present invention to provide a technique to eliminate the floating body effect in SOI integrated circuits. It is another object of the present invention to provide a technique to resolve the kink effect in SOI integrated circuits.

It is another object of the present invention to provide a technique to eliminate the parasitic bipolar effect and consequently the dynamic leakage current in SOI integrated circuits.

It is another object of the present invention to provide a technique to eliminate the floating body effect, which is applicable to commercial SOI products.

It is another object of the present invention to provide a complete solution to eliminate the floating body effect while keeping the conventional layout compatibility.

Accordingly, the invention is directed to a SOI semiconductor integrated circuit and a method of making the same. The SOI integrated circuit of the invention is formed on an SOI substrate including a supporting substrate, a buried insulating layer on the supporting substrate and a semiconductor layer of a first conductivity type on the buried insulating layer. The SOI integrated circuit of the invention includes at least one isolated transistor active region including a predetermined region of the semiconductor layer. A body line of the first conductivity type is disposed at one side of the transistor active region, the body line including a portion of the semiconductor layer. An isolation layer surrounds sidewalls of the transistor active region and the body line, the isolation layer being in contact with the buried insulating layer. A body extension of the first conductivity type extends from a predetermined sidewall of the transistor active region and is connected to the body line, the body extension being thinner than the transistor active region. A body insulating layer is formed on the body extension. An insulated gate pattern crosses over the transistor active region, the insulated gate pattern overlapping with the body insulating layer.

In accordance with the present invention, provided are SOI semiconductor integrated circuits having a body extension which connects a body region of an SOI MOSFET to a body line tied to the power line or the ground line and methods of fabricating the SOI semiconductor integrated circuits.

An SOI integrated circuit according to an embodiment of the present invention comprises at least one isolated SOI MOSFET surrounded by insulator, a body line disposed at one side of the SOI MOSFET and a body extension which electrically connects a sidewall of a body region of the SOI MOSFET to the body line. Therefore, a plurality of SOI MOSFETs may be disposed at one side of the body line. In addition, the plurality of SOI MOSFETs may be disposed at both sides of the body line.

In one embodiment, the first conductivity type is P type. In an alternative embodiment, the first conductivity type is N type. In one embodiment, the SOI integrated circuit includes a metal silicide layer formed on the body line.

In one embodiment, a gate insulating layer is interposed between the insulated gate pattern and the transistor active region and one end of the insulated gate pattern is overlapped with the body insulating layer. The body insulating layer is thicker than the gate insulating layer. Thus, it can prevent an inversion channel from being formed at the body extension regardless of go the voltage applied to the insulated gate pattern. As a result, it becomes possible to implement an improved SOI MOSFET without floating bodies in the whole SOI integrated circuits.

The invention is also directed to a method of making a SOI semiconductor integrated circuit on an SOI substrate including a supporting substrate, a buried insulating layer on the supporting substrate and a semiconductor layer of a first conductivity type on the buried insulating layer. In accordance with the method, a predetermined region of the semiconductor layer is etched to form a trench region defining at least one isolated transistor active region and a body line active region at one side of the transistor active region and concurrently leaving a semiconductor residue layer, which is thinner than the semiconductor layer at a bottom of the trench region. The semiconductor residue layer is selectively etched until the buried insulating layer is exposed, thereby forming an isolation region and concurrently leaving a body extension of the first conductivity type connecting the transistor active region to the body line active region. A body insulating layer and an isolation layer are formed on the body extension and the exposed buried insulating layer, respectively. An insulated gate pattern is formed crossing over the transistor active region and overlapping with the body insulating layer. The body line active region is doped with impurities of the first conductivity type to form a body line.

A method of fabricating the SOI integrated circuit in accordance with the invention includes forming at least one SOI MOSFET at an SOI substrate, forming a body line disposed at one side of the SOI MOSFET and forming a body extension that electrically connects a body region of the SOI MOSFET to the body line. Here, the SOI substrate includes a supporting substrate, a buried insulating layer formed on the supporting substrate and a semiconductor layer formed on the buried insulating layer. Thus, a plurality of SOI MOSFETs may be formed at one side of the body line or at both sides of the bit line.

The method of forming the SOI MOSFET, the body line and the body extension comprises etching a predetermined region of the semiconductor layer to form a trench region defining at least one isolated transistor active region and a body line active region at one side of the transistor active region. The depth of the trench region is smaller than the thickness of the semiconductor layer. Thus, a semiconductor residue layer, which is thinner than the semiconductor layer, exists at the bottom of the trench region. A predetermined region of the semiconductor residue layer is then selectively etched until the buried insulating layer is exposed, thereby leaving a body extension that connects the transistor active region to the body line. Accordingly, an isolation region exposing the buried insulating layer is formed. As a result, the isolation region is deeper than the trench region exposing the body extension.

Subsequently, a body insulating layer and an isolation layer are formed in the trench region exposing the body extension and in the isolation region exposing the buried insulating layer, respectively. An insulated gate pattern crossing over the transistor active region is formed. The gate pattern is formed so that one end of the gate pattern is overlapped with the body insulating layer. Here, a gate insulating layer is formed between the gate pattern and the transistor active region. The body insulating layer is thicker than the gate insulating layer. Thus, even though a predetermined voltage in the range of operating voltage is applied to the gate pattern, it can prevent an inversion channel from being formed at the body extension under the body insulating layer. Impurity ions having the same conductivity type as the semiconductor layer, i.e., a body region of the SOI MOSFET are implanted into the body line active region to form a body line having a low resistivity.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT OF THE INVENTION

Figure 1:
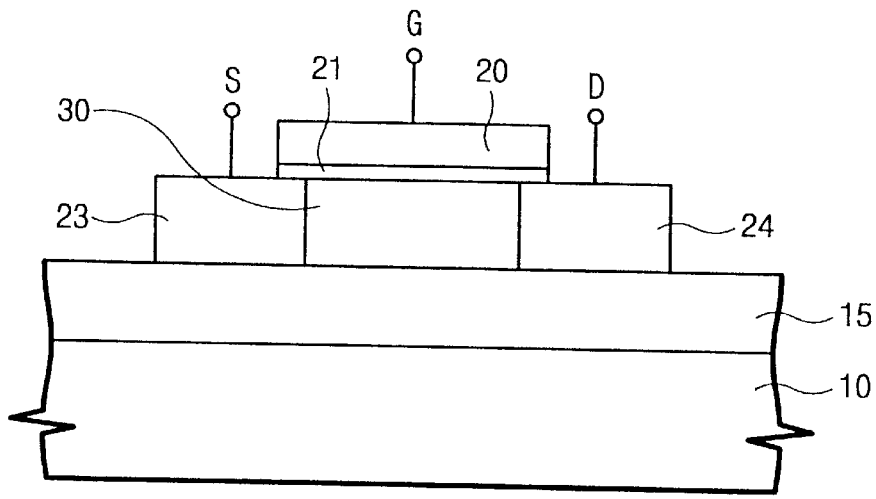
FIG. 1 is a schematic cross-sectional view illustrating a typical SOI MOSFET in accordance with the prior art.
Figure 2A:
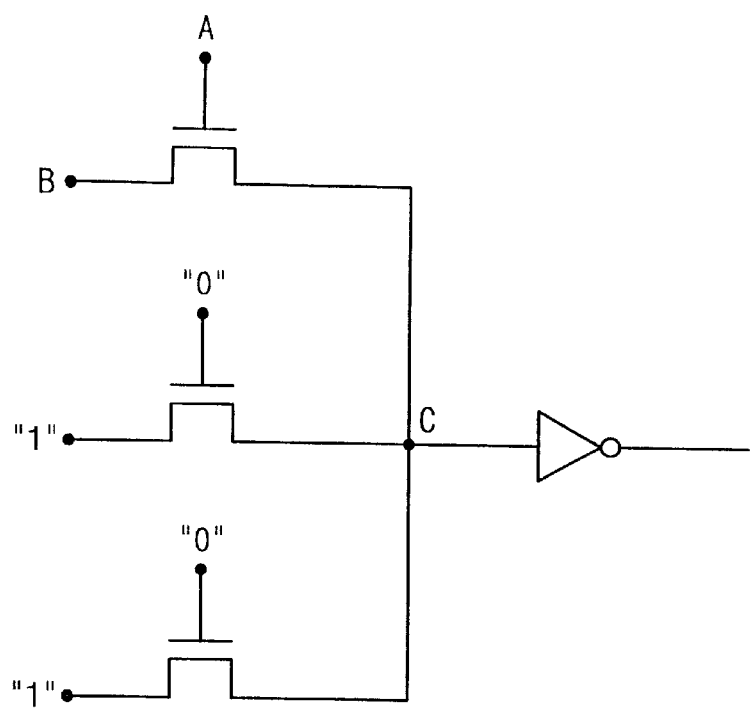
FIG. 2A is a schematic diagram illustrating a prior art multiplexer circuit.
Figure 2B:
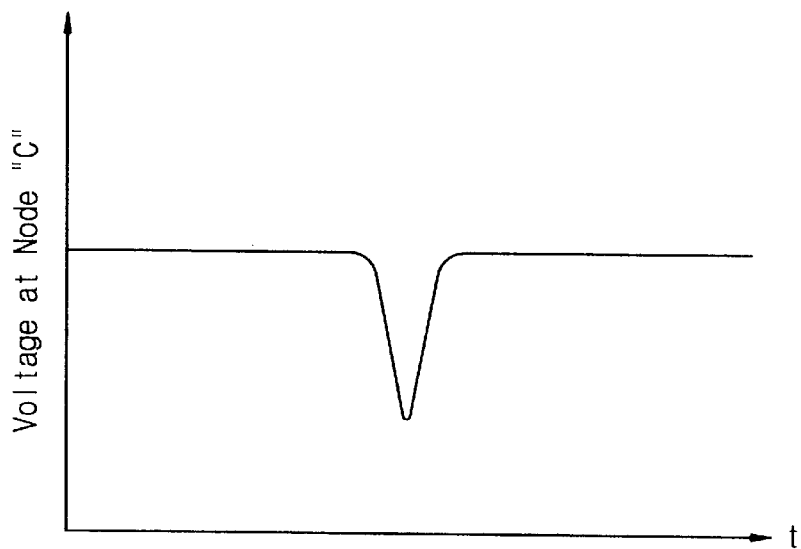
FIG. 2B is a plot illustrating the dynamic leakage current occurring due to the floating body effect in the prior art circuit of FIG. 2A.
Figure 3A:
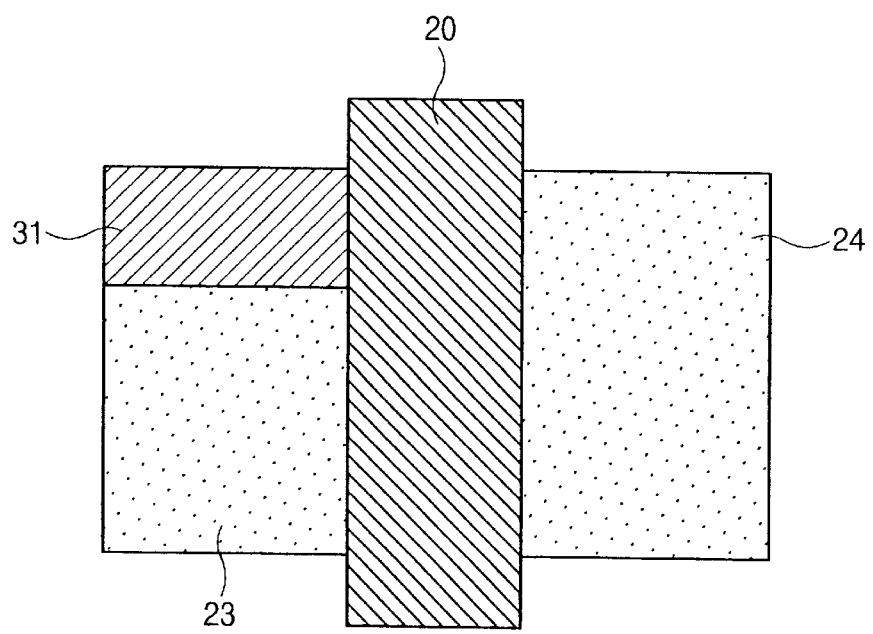
FIGS. 3A and 3B are schematic layouts for body contacted SOI MOSFETs in accordance with the prior art.
Figure 3B:
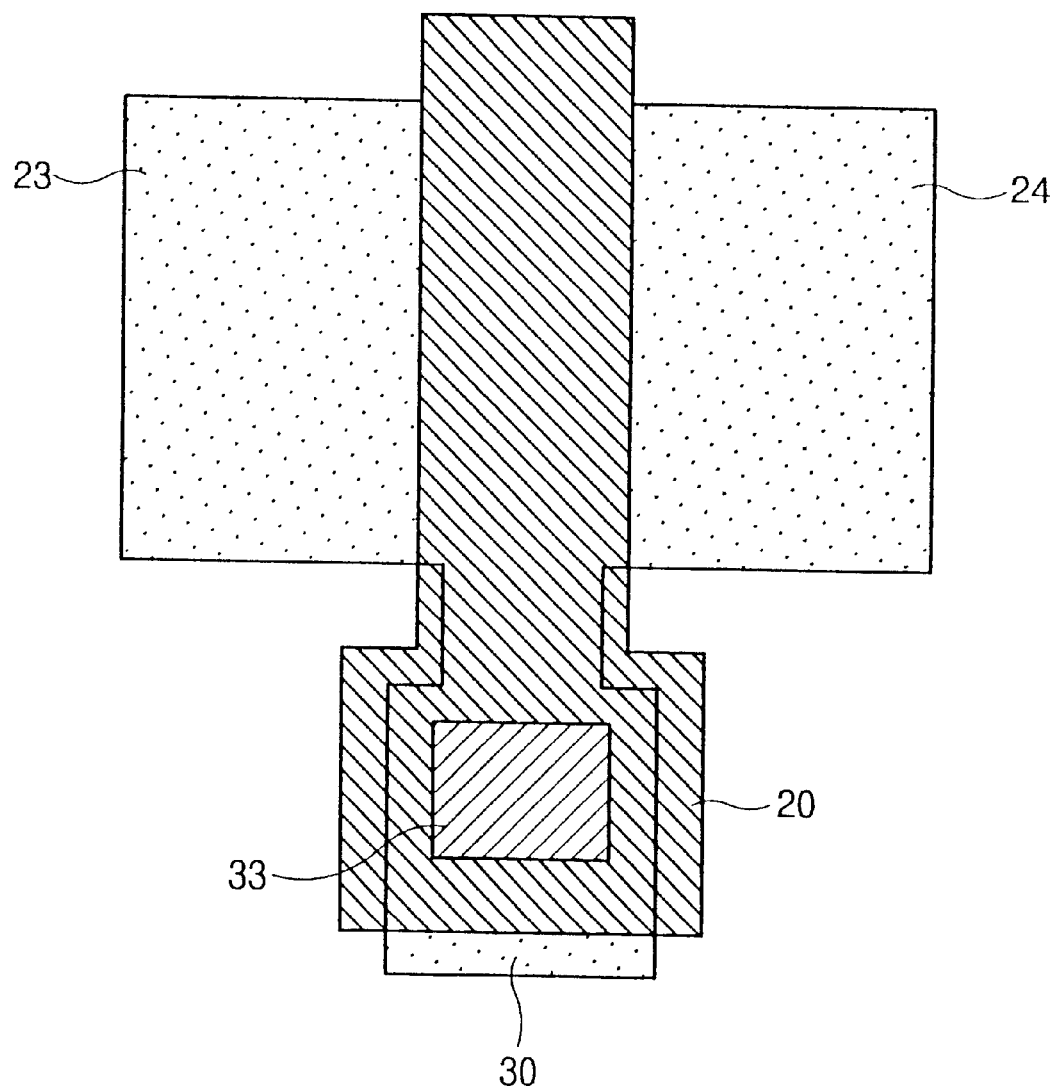
Figure 4A:
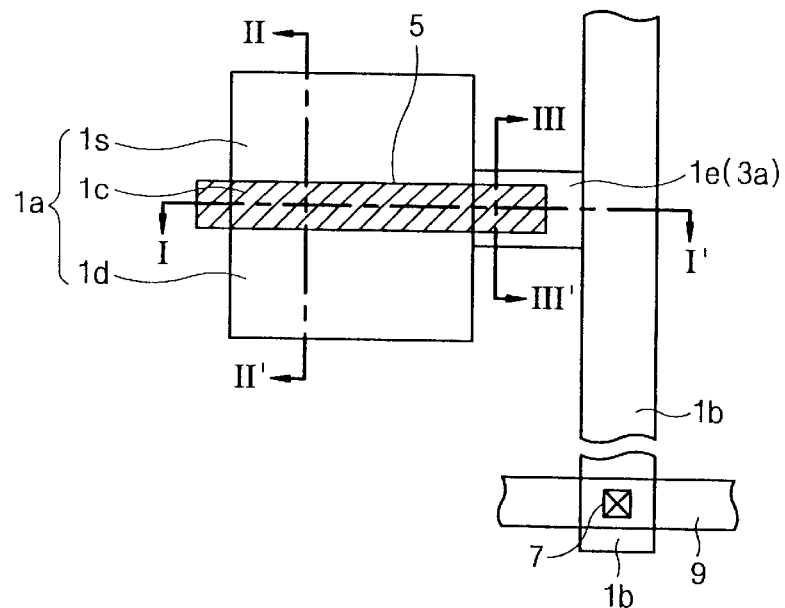
FIG. 4A is a top view of one embodiment of an SOI integrated circuit in accordance with the present invention.
Figure 5:
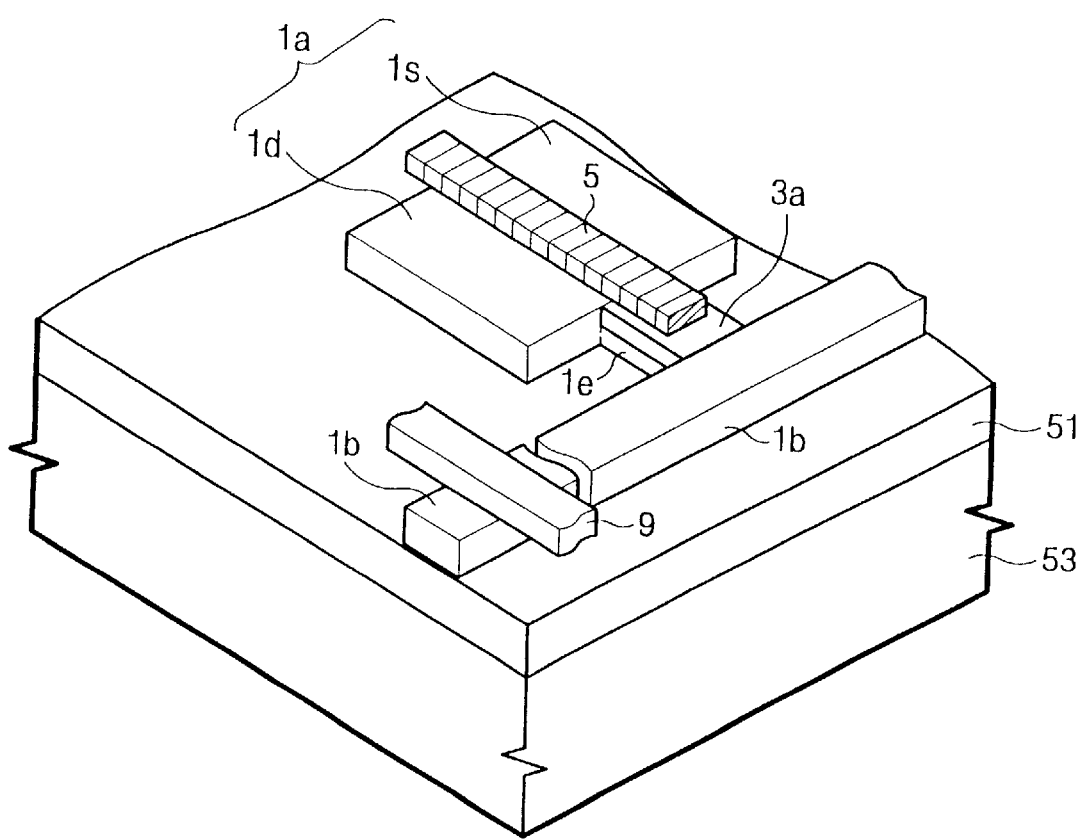
FIG. 5 is a schematic perspective view of the SOI integrated circuit in accordance with the present invention.

The present invention will be explained in detail with reference to the accompanying drawings. FIGS. 4A and 5 are a top view and a perspective view, respectively, showing a portion of an SOI integrated circuit according to an embodiment of the present invention. An SOI integrated circuit in accordance with the invention including N-MOSFETs will be described with reference to FIGS. 4A and 5. However, the present invention is applicable to SOI integrated circuits including P-MOSFETs. Also, the SOI integrated circuit of the present invention could be implemented using N-MOSFETs and P-MOSFETs.

Referring to FIGS. 4A and 5, at least one isolated transistor active region 1a is located at a predetermined region of an SOI substrate. A body line 1b is disposed at one side of the transistor active region Ia. In detail, the transistor active region 1a may be disposed at one side of the body line 1b. The body line 1b is electrically connected to a body extension 1e which is extended from a sidewall of the transistor active region 1a. Also, the body line 1b preferably has a straight line shape. The SOI substrate includes a supporting substrate 53, a buried insulating layer 51 stacked on the supporting substrate 53, and a semiconductor layer stacked on the buried insulating layer 51. The semiconductor layer has a first conductivity type. The first conductivity type may be a P-type or an N-type. In the event that the semiconductor layer is a P-type, an SOI N-MOSFET is formed at the semiconductor layer. In the event that the semiconductor layer is an N-type, an SOI P-MOSFET is formed at the semiconductor layer. The semiconductor layer may be a silicon layer, a germanium layer or a compound semiconductor layer.

The transistor active region 1a, the body line 1b and the body extension 1e are formed of portions of the semiconductor layer. Also, these three regions have the same conductivity type. The body extension 1e is thinner than the transistor active region 1a and the body line 1b, and the bottom surface of the body extension 1e is in contact with the buried insulating layer 51. Thus, the top surface of the body extension 1e is lower than those of the transistor active region 1a and the body line 1b. The top surface of the body extension 1e is covered with a body insulating layer 3a. Also, the buried insulating layer 51 at the periphery of the transistor active region 1a, the body line 1b and the body extension 1e is covered with an isolation layer (not shown).

An insulated gate pattern including a gate electrode 5 is stacked over the transistor active region 1a. The gate electrode 5 crosses over the transistor active region 1a, and one end of the gate electrode 5 is overlapped with the body insulating layer 3a. A gate insulating layer (not shown) is interposed between the gate electrode 5 and the transistor active region 1a. The gate insulating layer is thinner than the body insulating layer 3a. Thus, even though an operating voltage is applied to the gate electrode 5, it can prevent an inversion channel from being formed at the body extension 1e under the body insulating layer 3a.

A source region 1s of a second conductivity type is formed at the transistor region 1a which is located at one side of the gate electrode 5, and a drain region 1d of the second conductivity type is formed at the transistor region 1a which is located at the other side of the gate electrode 5. Accordingly, the transistor active region 1a under the gate electrode 5 corresponds to a body region 1c including a channel region. The gate electrode 5, the source/drain regions 1s and 1d, and the body region 1c constitute an SOI MOSFET. In addition, an insulating spacer (not shown) may be formed on a sidewall of the gate electrode 5 or the gate pattern including the gate electrode 5. A metal silicide layer (not shown) may be selectively stacked on the source/drain regions 1s and 1d and the body line 1b. The metal silicide layer is electrically isolated from the gate electrode 5 due to the presence of the insulating spacer. Also, the metal silicide layer may be further stacked on the gate electrode 5.

The SOI substrate including the SOI MOSFET and the metal silicide layer is covered with an interlayer insulating layer (not shown). An interconnection line 9 such as a power line or a ground line is disposed on the interlayer insulating layer. The interconnection line 9 is electrically connected to the body line 1b through a contact hole 7 penetrating a portion of the interlayer insulating layer. Here, in the event that the SOI MOSFET is a P-MOSFET, the interconnection line corresponds to the power line. In the event that the SOI MOSFET is an N-MOSFET, the interconnection line corresponds to the ground line.

Figure 4B:
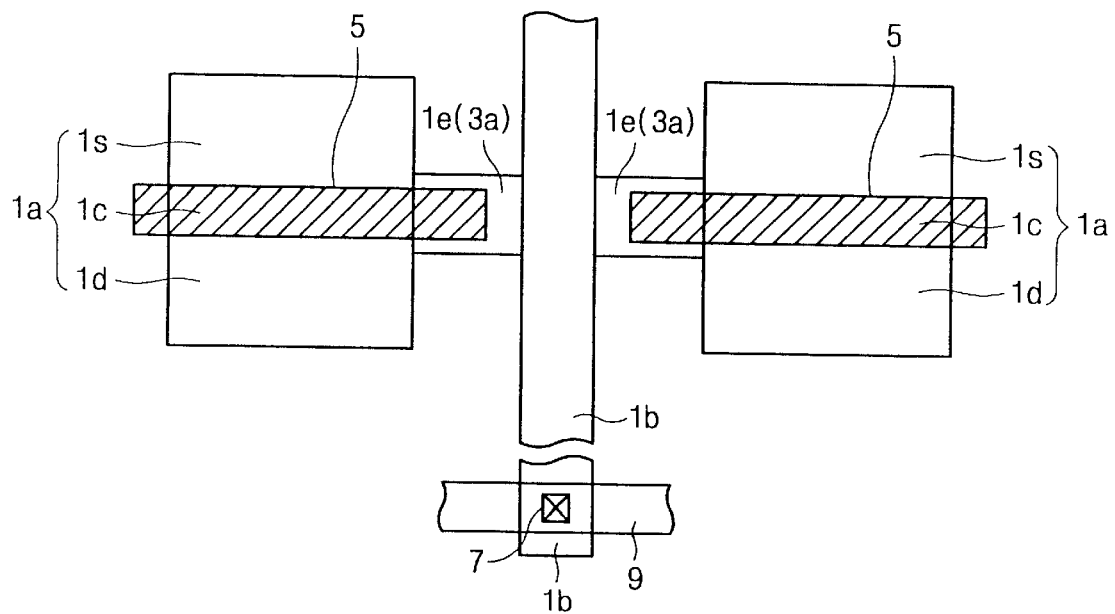
FIG. 4B is a top view of another embodiment of an SOI integrated circuit in accordance with the present invention.

A plurality of SOI MOSFETs may be disposed at both sides of the body line 1b, as shown in FIG. 4B. Here, each of the SOI MOSFETs has the same structure as the SOI MOSFET described in connection with FIGS. 4A and 5. FIGS. 6A to 11A, FIGS. 6B to 11B and FIGS. 6C to 11C are cross-sectional views for illustrating fabrication methods of SOI integrated circuits according to the present invention. FIGS. 6A to 11A are cross-sectional views taken along the line I–I' of FIG. 4A, and FIGS. 6B to 11B are cross-sectional views taken along the line II–II' of FIG. 4. Also, FIGS. 6C to 11C are cross-sectional views taken along the line III–III' of FIG. 4.

Figure 6A:
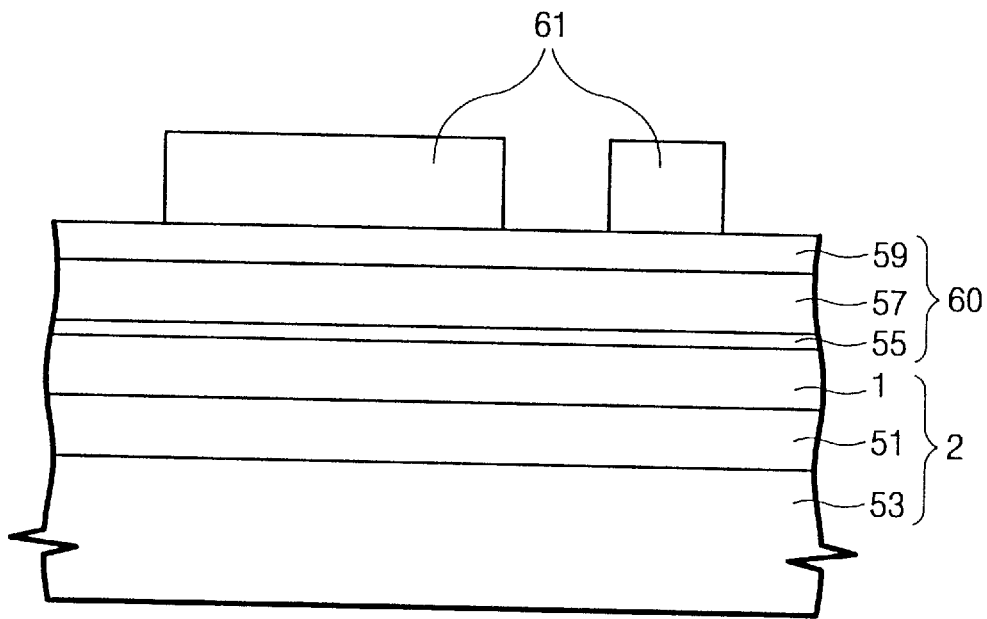
FIGS. 6A, 7A, 8A, 9A, 10A and 11A are cross-sectional views taken along the line I–I' of FIG. 4A for illustrating a method of fabricating SOI integrated circuit according to one embodiment of the present invention.
Figure 6B:
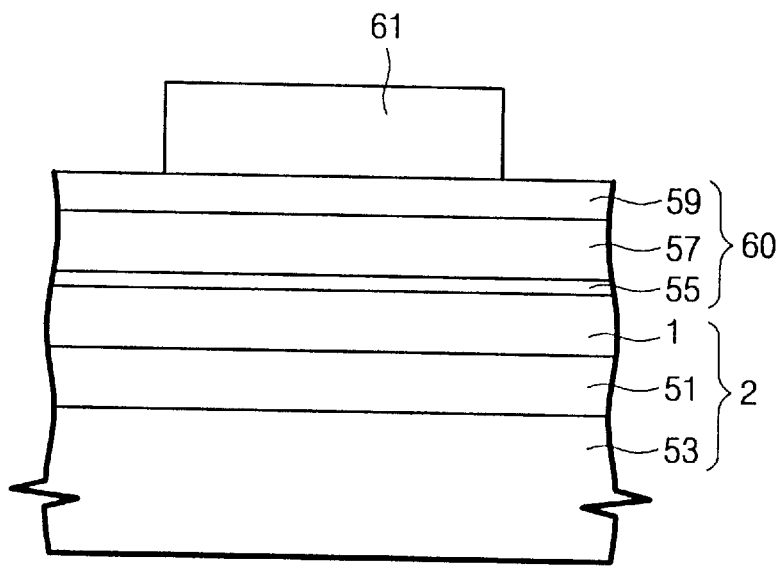
FIGS. 6B, 7B, 8B, 9B, 10B and 11B are cross-sectional views taken along the line II–II' of FIG. 4A for illustrating a method of fabricating SOI integrated circuit according to one embodiment of the present invention.
Figure 6C:
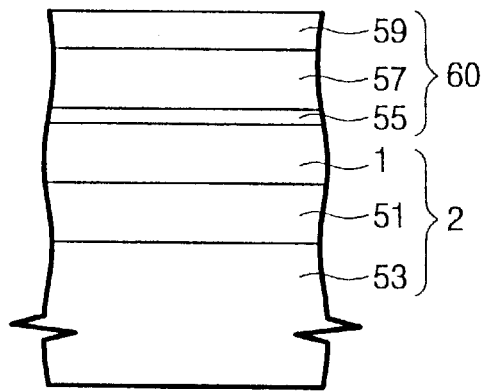
FIGS. 6C, 7C, 8C, 9C, 10C and 11C are cross-sectional views taken along the line III–III' of FIG. 4A for illustrating a method of fabricating SOI integrated circuit according to one embodiment of the present invention.

Referring to FIGS. 6A, 6B and 6C, a trench mask layer 60 is formed on an SOI substrate The SOI substrate 2 includes a supporting substrate 53, a buried insulating layer 51 formed on the supporting substrate 53 and a semiconductor layer 1 formed on the buried insulating layer 51. Here, the semiconductor layer 1 has a first conductivity type such as a P-type. However, the first conductivity type may be an N-type. Thus, the trench mask layer 60 is formed on the semiconductor layer 1 of the first conductivity type. The trench mask layer 60 comprises a pad oxide layer 55 and a pad nitride layer 57 which are sequentially stacked. In addition, the trench mask layer may further comprise a hard mask layer 59 formed on the pad nitride layer 57. The hard mask layer 59 is preferably formed of a CVD oxide layer having a high etching selectivity with respect to the semiconductor layer 1 such as a silicon layer. First photoresist patterns 61 are formed on the trench mask layer 60. At least one of the first photoresist patterns 61 defines at least one isolated transistor active region. The other defines a body line active region at one side of the transistor active region.

Figure 7A:
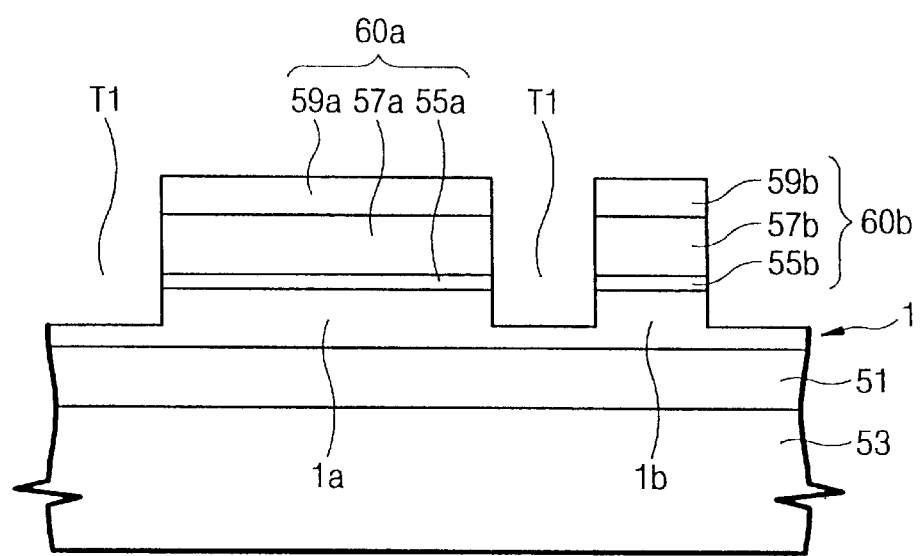
Figure 7B:
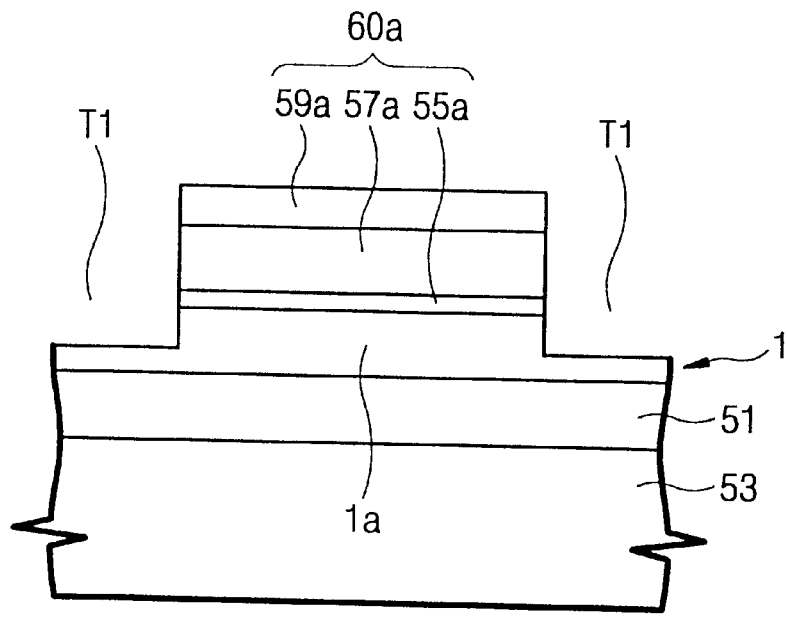
Figure 7C:
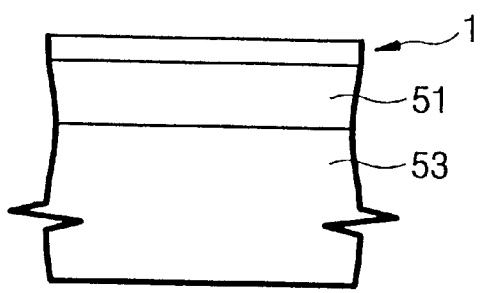

Referring to FIGS. 7A, 7B and 7C, the trench mask layer 60 is etched using the first photoresist patterns 61 as etching masks until the semiconductor layer 1 is exposed. As a result, at least one first trench mask pattern 60a and a second trench mask pattern 60b are formed. The first trench mask pattern 60a comprises a first pad oxide pattern 55a, a first pad nitride pattern 57a and a first hard mask pattern 59a which are sequentially stacked. Similarly, the second trench mask pattern 60b comprises a second pad oxide pattern 55b, a second pad nitride pattern 57b and a second hard mask pattern 59b which are sequentially stacked. The first photoresist patterns 61 are then removed.

Subsequently, the exposed semiconductor layer 1 is etched using the first and second trench mask patterns 60a and 60b as etching masks, to thereby form a trench region Ti. At this time, the exposed semiconductor layer 1 is etched by a predetermined thickness which is thinner than that of the semiconductor layer 1. As a result, a semiconductor residue layer exists at the bottom of the trench region T1. Also, at least one transistor active region 1a and a body line active region 1b are defined by the trench region T1. Accordingly, the buried insulating layer 51 outside the transistor active region 1a and the body line active region 1b is still covered with the semiconductor residue layer.

Figure 8A:
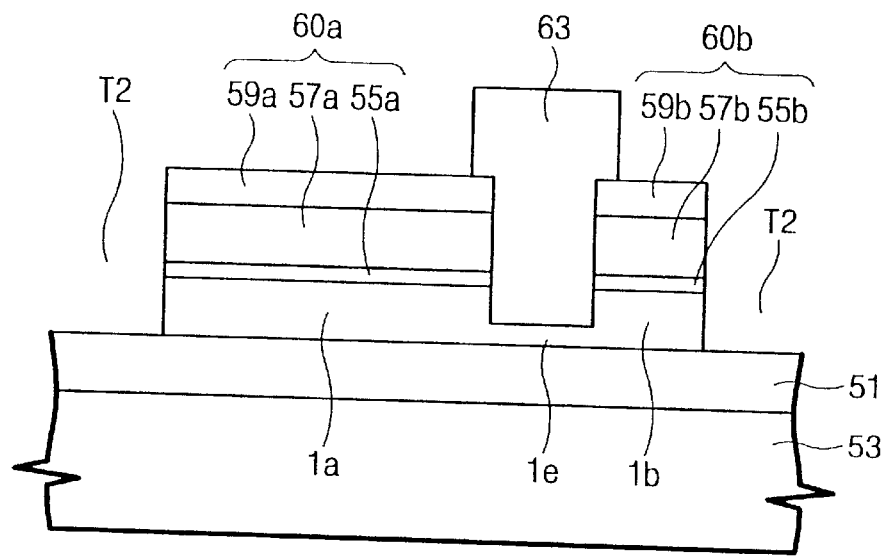
Figure 8B:
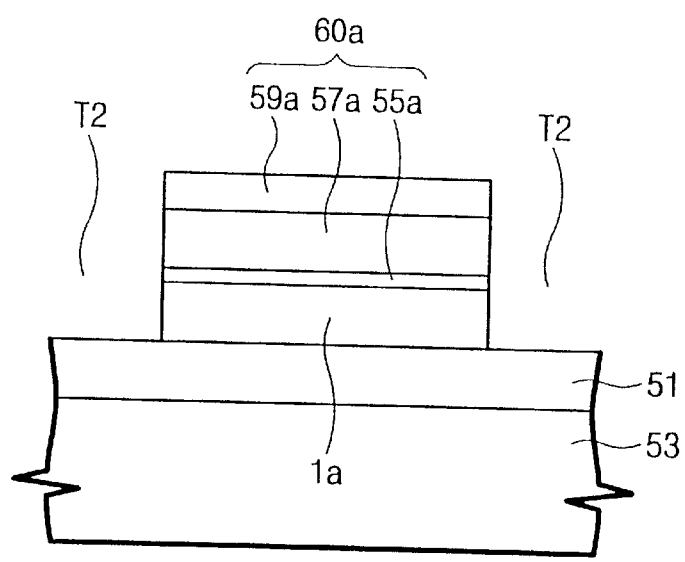
Figure 8C:
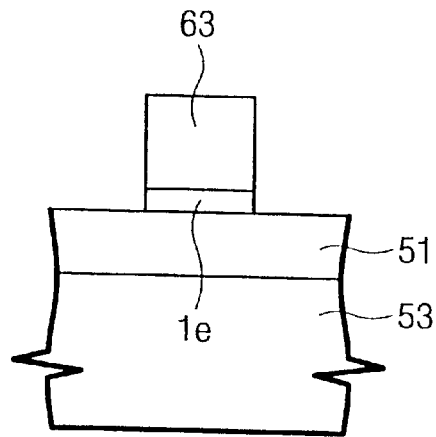

Referring to FIGS. 8A, 8B and 8C, a second photoresist pattern 63 is formed on a predetermined region of the semiconductor residue layer. The second photoresist pattern 63 covers a portion of the semiconductor residue layer between the transistor active region 1a and the body line active region 1b, as shown in FIGS. 8A and 8C. The semiconductor residue layer is etched using the second photoresist pattern 63 and the first and second trench mask patterns 60a and 60b as etching masks until the buried insulating layer 51 is exposed. As a result, an isolation region T2 exposing the buried insulating layer 51 is formed.

At this time, a body extension 1e including a portion of the semiconductor residue layer is also formed under the second photoresist pattern 63, as shown in FIGS. 8A and 8C. Therefore, the body line active region 1b is electrically connected to the transistor active region 1a through the body extension 1e.

Figure 9A:
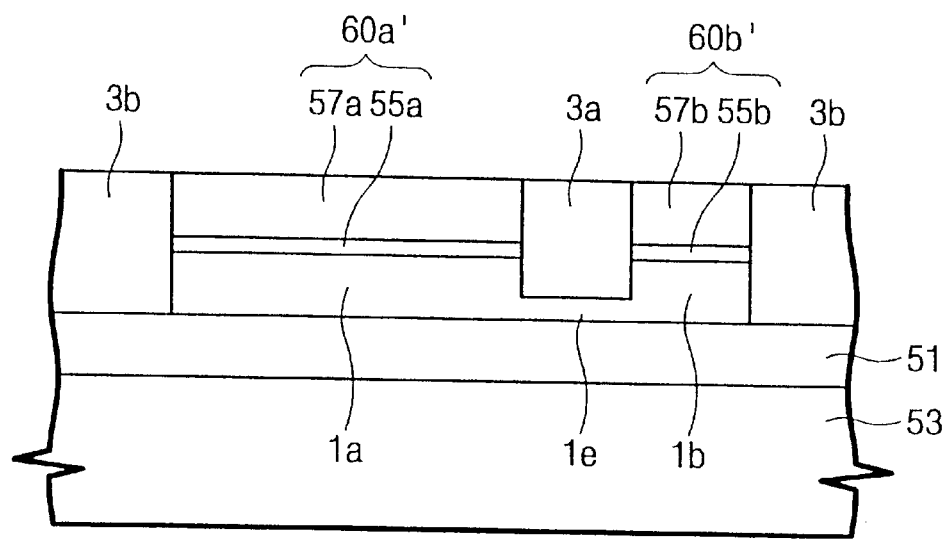
Figure 9B:
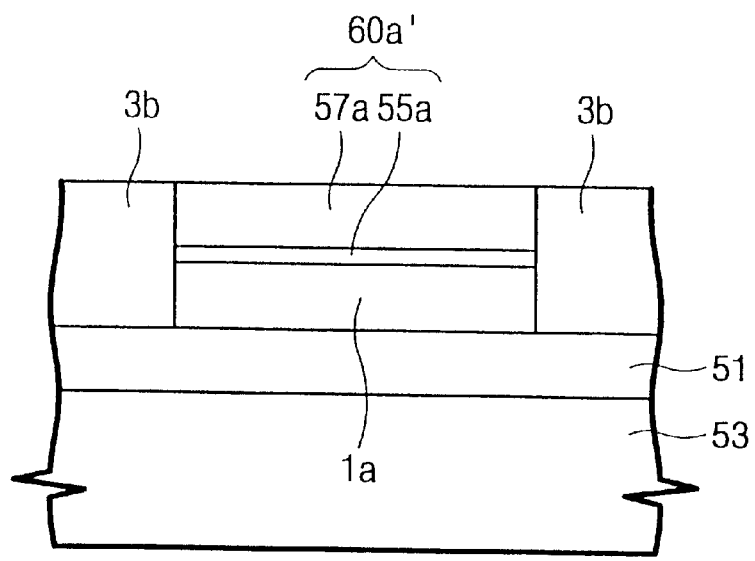
Figure 9C:
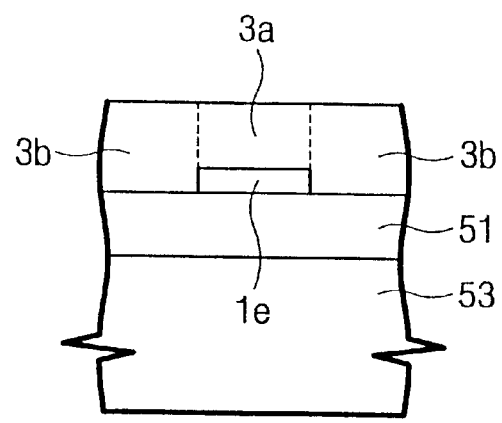

Referring to FIGS. 9A, 9B and 9C, the second photoresist pattern 63 is then removed. An insulating layer such as a CVD oxide layer is formed on the entire surface of the substrate including the trench region T1 and the isolation region T2. At this time, it is preferable that the trench region T1 and the isolation region T2 be completely filled with the insulating layer.

The insulating layer is then planarized until the first and second trench mask patterns 60a and 60b are exposed, thereby forming a body insulating layer 3a on the body extension 1e as well as an isolation layer 3b on the buried insulating layer 51. At this time, the first and second pad nitride patterns 57a and 57b act as etch stoppers. Thus, in the event that the trench mask layer 60 comprises the CVD oxide layer 59, the first and second hard mask patterns 59a and 59b are removed during the planarization process such as an etch-back process or a CMP (chemical mechanical polishing) process. As a result, first and second transformed trench mask patterns 60a and 60b are left after formation of the body insulating layer 3a and the isolation layer 3b.

Figure 10A:
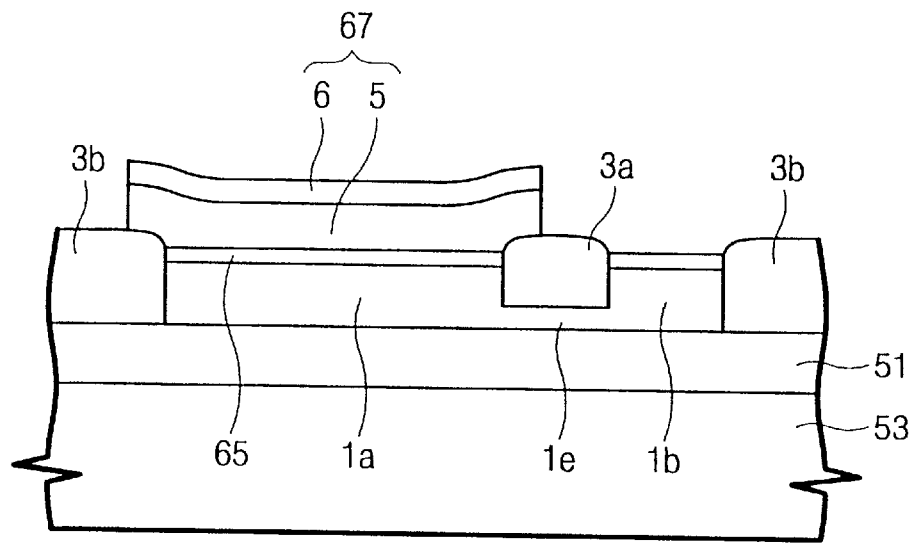
Figure 10B:
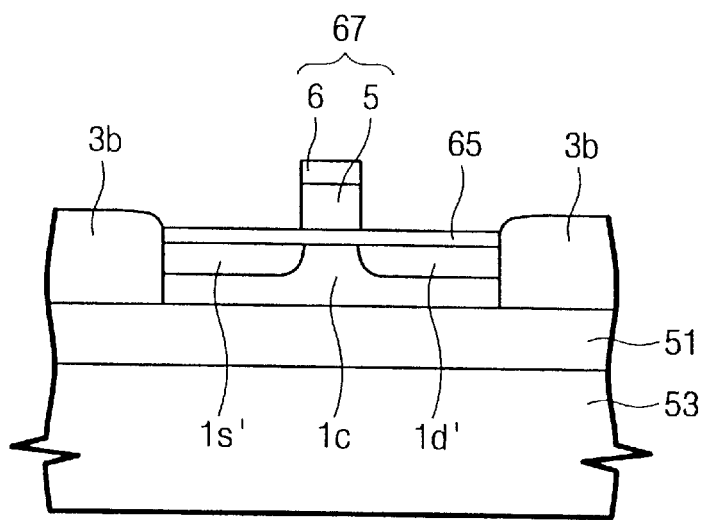
Figure 10C:
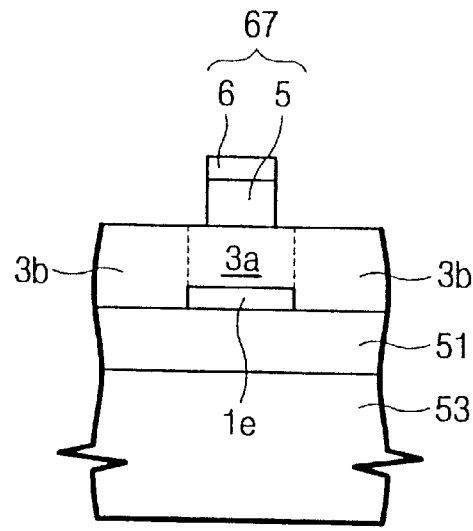

Referring to FIGS. 10A, 10B and 10C, the first and second transformed trench mask patterns 60a and 60b are then removed using a conventional technique, to thereby expose the transistor active region 1a and the body line active region 1b. A gate insulating layer 65 is formed on the exposed transistor active region 1a and the exposed body line active region 1b. A gate material layer is formed on the entire surface of the substrate including the gate insulating layer 65. The gate material layer is formed by sequentially stacking a conductive layer and a capping insulating layer. Preferably, the conductive layer is formed of a doped polysilicon layer and the capping insulating layer is formed of a CVD oxide layer or a silicon nitride layer. Alternatively, the gate material layer may be formed of only the conductive layer. The gate material layer is then patterned to form an insulated gate pattern 67 crossing over the transistor active region 1a. Also, one end of the gate pattern 67 is overlapped with the body insulating layer 3a, as shown in FIGS. 10A and 10C. In the event that the gate material layer is formed by sequentially stacking the conductive layer and the capping insulating layer, the insulated gate pattern 67 comprises a gate electrode 5 formed of the conductive layer and a capping insulating layer pattern 6 formed of the capping insulating layer. However, in the event that the formation of the capping insulating layer is omitted, the insulated gate pattern 67 is formed of only the gate electrode 5.

Impurities of a second conductivity type are selectively implanted into the transistor active region 1a using the gate pattern 67 as an implantation mask, thereby forming low concentration impurity regions 1s and 1d at both sides of the gate pattern 67, respectively. The second conductivity type is opposite to the first conductivity type. For example, if the first conductivity type is P-type, the second conductivity type is N-type. The transistor active region 1a between the low concentration impurity regions 1s and 1d corresponds to a body region 1c.

Figure 11A:
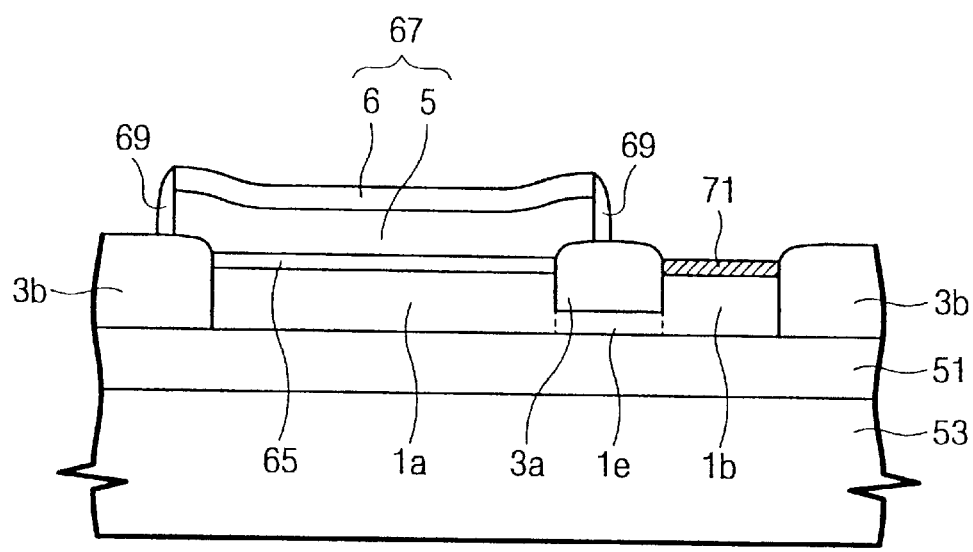
Figure 11B:
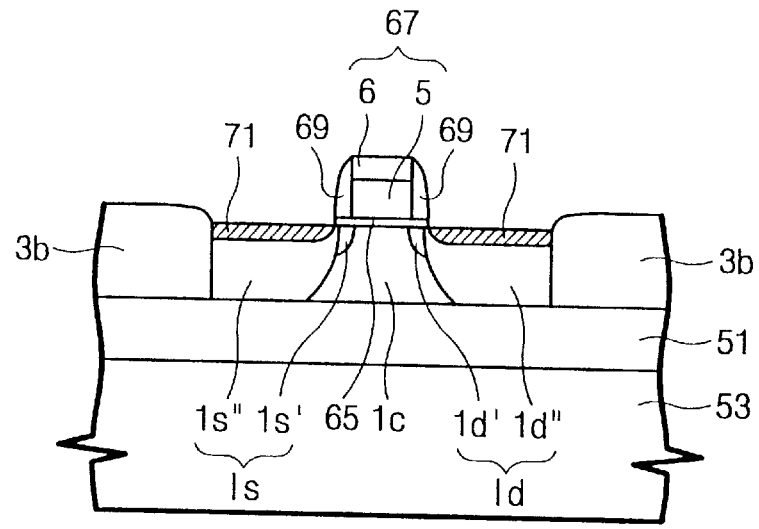
Figure 11C:
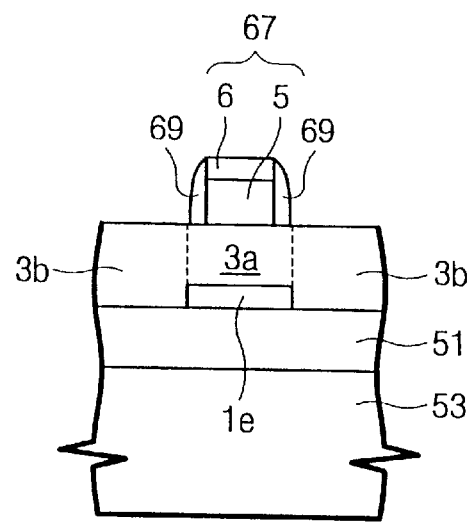

The body region 1c includes a channel region which is located under the gate pattern 67. Referring to FIGS. 11A, 11B and 11C, an insulating spacer 69 is then formed on the sidewall of the insulated gate pattern 67 using a conventional technique. The insulating spacer 69 is formed of a silicon oxide layer or a silicon nitride layer. Subsequently, impurities of the second conductivity type are selectively implanted into the transistor active region 1a using the gate pattern 67 and the insulating spacer 69 as implantation masks, thereby forming high concentration impurity regions 1s and 1d at both sides of the gate pattern 67. As a result, the low concentration impurity regions 1s and 1d exist under the insulating spacer 69. Thus, LDD(lightly doped drain)-type source and drain regions 1s and 1d are formed at both sides of the gate pattern 67. Therefore, the body region 1c is electrically connected to the body line active region 1b through the body extension 1e, as shown in FIGS. 11A, 11B and 11C. Here, the gate electrode 5, the source/drain regions 1s and 1d, and the body region 1c constitute an SOI MOSFET.

Impurities of the first conductivity type are selectively implanted into the body line active region 1b in order to form a body line 1b having a relatively low resistance. A cleaning process is applied to the surface of the resultant structure, thereby exposing the surfaces of the source and drain regions 1s and 1d and the body line 1b. A metal silicide layer 71 may be selectively formed on the exposed body line 1b as well as the exposed source and drain regions 1s and 1d using a conventional SALICIDE(self-aligned silicide) process. The metal silicide layer 71 is formed of a refractory metal silicide layer such as a titanium silicide layer, a tantalum silicide layer, or a cobalt silicide layer. In the event that the gate pattern 67 is formed of only the gate electrode 5, the metal silicide layer 71 is also formed on the gate electrode 5.

An interlayer insulating layer (not shown) is formed on the entire surface of the substrate including the metal silicide layer 71. The interlayer insulating layer is patterned to form a contact hole 7 (see FIG.4) exposing a portion of the body line 1b. A conductive layer filling the contact hole 7 is formed on the interlayer insulating layer and patterned to form a interconnection line 9 (see FIGS.4 and 5) which is electrically connected to the body line 1b via the contact hole 7. The interconnection line 9 may be a power line or a ground line. For example, if the SOI MOSFET is an N-MOSFET, the interconnection line 9 corresponds to the ground line. If the SOI MOSFET is a P-MOSFET, the interconnection line 9 corresponds to the power line.

As described above, the present invention can prevent the body region of the SOI MOSFET from being electrically floated. Therefore, it can be used to realize reliable and compact SOI integrated circuits.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A silicon-on-insulator (SOI) semiconductor integrated circuit formed on an SOI substrate including a supporting substrate, a buried insulating layer on the supporting substrate and a semiconductor layer of a first conductivity type on the buried insulating layer, the integrated circuit comprising:

at least one isolated transistor active region comprising a predetermined region of the semiconductor layer;

a body line of the first conductivity type disposed at one side of the transistor active region, the body line including a portion of the semiconductor layer;

an isolation layer surrounding sidewalls of the transistor active region and the body line, the isolation layer being in contact with the buried insulating layer;

a body extension of the first conductivity type extended from a predetermined sidewall of the transistor active region and connected to the body line, the body extension being thinner than the transistor active region;

a body insulating layer formed on the body extension; and an insulated gate pattern crossing over the transistor active region, the insulated gate pattern overlapping with the body insulating layer.

2. The silicon-on-insulator (SOI) semiconductor integrated circuit of claim 1, wherein the first conductivity type is one of P-type and N-type.

3. The silicon-on-insulator (SOI) semiconductor integrated circuit of claim 1, further comprising a metal silicide layer formed on the body line.

4. The silicon-on-insulator (SOI) semiconductor integrated circuit of claim 1, further comprising a gate insulating layer interposed between the insulated gate pattern and the transistor active region.

5. The silicon-on-insulator (SOI) semiconductor integrated circuit of claim 1, further comprising an insulating spacer formed on a sidewall of the insulated gate pattern.

6. The silicon-on-insulator (SOI) semiconductor integrated circuit of claim 1, wherein the gate pattern comprises a conductive gate electrode.

7. The silicon-on-insulator (SOI) semiconductor integrated circuit of claim 6, further comprising a metal silicide layer formed on the gate electrode.

8. The silicon-on-insulator (SOI) semiconductor integrated circuit of claim 1, wherein the gate pattern comprises a conductive gate electrode and a capping insulating layer formed on the gate electrode.

9. The silicon-on-insulator (SOI) semiconductor integrated circuit of claim 1, further comprising:

a source region formed at the transistor active region and located at one side of the gate pattern; and a drain region formed at the transistor active region and located at the other side of the gate pattern, the source and drain regions having a second conductivity type opposite to the first conductivity type.

10. The silicon-on-insulator (SOI) semiconductor integrated circuit of claim 9, further comprising a metal silicide layer formed on the source and drain regions.

11. The silicon-on-insulator (SOI) semiconductor integrated circuit of claim 1, further comprising one of a ground line and a power line running over the body line, the one of the ground line and the power line being electrically connected to the body line.

12. The silicon-on-insulator (SOI) semiconductor integrated circuit of claim 1, wherein the body line is a straight line.

13. The silicon-on-insulator (SOD semiconductor integrated circuit of claim 1, wherein the at least one transistor active region comprises a plurality of transistor active regions.

14. The silicon-on-insulator (SOD semiconductor integrated circuit of claim 13, wherein the plurality of transistor active regions are disposed at one side or both sides of the body line.

* * * * *

UNITED STATES PATENT AND TRADEMARK OFFICE
CERTIFICATE OF CORRECTION

PATENT NO.    : 6,498,370 B1
DATED         : December 24, 2002
INVENTOR(S)   : Young-Wug Kim et al.

It is certified that error appears in the above-identified patent and that said Letters Patent is hereby corrected as shown below:

Column 10,
Lines 58 and 62, delete "(SOD" and insert -- (SOI) --

Signed and Sealed this

Fifth Day of August, 2003

JAMES E. ROGAN
*Director of the United States Patent and Trademark Office*